United States Patent
Schubert et al.

(10) Patent No.: US 10,541,112 B2
(45) Date of Patent: Jan. 21, 2020

(54) CHARGED PARTICLE BEAM SYSTEM AND METHOD OF OPERATING THE SAME

(71) Applicants: Carl Zeiss Microscopy GmbH, Jena (DE); Applied Materials Israel, Ltd., Rehovot (IL)

(72) Inventors: Stefan Schubert, Oberkochen (DE); Thomas Kemen, Meppen (DE); Rainer Knippelmeyer, Herrsching am Ammersee (DE)

(73) Assignees: Carl Zeiss Microscopy GmbH, Jena (DE); Applied Materials Israel, Ltd., Rehovot (IL)

( * ) Notice: Subject to any disclaimer, the term of this patent is extended or adjusted under 35 U.S.C. 154(b) by 0 days.

(21) Appl. No.: 16/176,392

(22) Filed: Oct. 31, 2018

(65) Prior Publication Data
US 2019/0066974 A1 Feb. 28, 2019

Related U.S. Application Data

(63) Continuation of application No. 15/026,189, filed as application No. PCT/EP2014/002656 on Sep. 30, 2014, now Pat. No. 10,121,635.
(Continued)

(51) Int. Cl.
*H01J 37/28* (2006.01)
*H01J 37/147* (2006.01)

(52) U.S. Cl.
CPC .......... *H01J 37/28* (2013.01); *H01J 37/1472* (2013.01); *H01J 2237/047* (2013.01)

(58) Field of Classification Search
USPC ....................................................... 250/424
See application file for complete search history.

(56) References Cited

U.S. PATENT DOCUMENTS

| | | |
|---|---|---|
| 5,892,224 A | 4/1999 | Nakasuji |
| 6,194,729 B1 | 2/2001 | Weimer |
| (Continued) | | |

FOREIGN PATENT DOCUMENTS

| | | |
|---|---|---|
| CN | 101103417 A | 1/2008 |
| CN | 101379584 A | 3/2009 |
| (Continued) | | |

OTHER PUBLICATIONS

Extended European Search Report for Application No. 18203476.9, dated Feb. 11, 2019, 7 pages.
(Continued)

*Primary Examiner* — Phillip A Johnston
(74) *Attorney, Agent, or Firm* — Morris & Kamlay LLP

(57) ABSTRACT

A charged particle beam system comprises a particle beam source having a particle emitter at a first voltage, a first electrode downstream of the particle beam source at a second voltage, a multi-aperture plate downstream of the first electrode, a second electrode downstream of the multi-aperture plate at a third voltage, a third electrode downstream of the second electrode at a fourth voltage, a deflector downstream of the third electrode, an objective lens downstream of the deflector, a fourth electrode downstream of the deflector at a fifth voltage; and an object mount at a sixth voltage. Voltage differences between the first, second, third, fourth and fifth voltages have same and opposite signs.

34 Claims, 7 Drawing Sheets

Related U.S. Application Data

(60) Provisional application No. 61/884,218, filed on Sep. 30, 2013.

(56) References Cited

U.S. PATENT DOCUMENTS

| | | | | |
|---|---|---|---|---|
| 6,943,349 | B2* | 9/2005 | Adamec | H01J 37/04 |
| | | | | 250/306 |
| 7,067,807 | B2 | 6/2006 | Petrov | |
| 7,244,949 | B2 | 7/2007 | Knippelmeyer | |
| 7,420,164 | B2* | 9/2008 | Nakasuji | H01J 37/141 |
| | | | | 250/307 |
| 7,960,697 | B2 | 6/2011 | Chen | |
| 8,445,846 | B2* | 5/2013 | Frosien | H01J 37/12 |
| | | | | 250/307 |
| 2003/0066961 | A1 | 4/2003 | Kienzle | |
| 2006/0289804 | A1 | 12/2006 | Knippelmeyer | |
| 2009/0114818 | A1 | 5/2009 | Casares | |
| 2009/0159810 | A1 | 6/2009 | Knippelmeyer | |
| 2009/0256075 | A1 | 10/2009 | Kemen | |
| 2010/0237243 | A1 | 9/2010 | Noji | |
| 2010/0320382 | A1 | 12/2010 | Almogy | |
| 2012/0091358 | A1 | 4/2012 | Wieland | |
| 2013/0032729 | A1 | 2/2013 | Knippelmeyer | |
| 2013/0187046 | A1 | 7/2013 | Zeidler | |
| 2014/0197322 | A1 | 7/2014 | Eder | |
| 2014/0224985 | A1 | 8/2014 | Rodgers | |
| 2015/0069235 | A1 | 3/2015 | Anger | |
| 2015/0083911 | A1 | 3/2015 | Jacobi | |
| 2015/0090879 | A1 | 4/2015 | Knippelmeyer | |
| 2015/0348738 | A1 | 12/2015 | Zeidler | |
| 2015/0348749 | A1 | 12/2015 | Lang | |
| 2015/0357157 | A1 | 12/2015 | Mueller | |

FOREIGN PATENT DOCUMENTS

| | | |
|---|---|---|
| EP | 1280184 | 1/2003 |
| WO | 2005024881 A2 | 3/2005 |
| WO | 2007028595 | 3/2007 |
| WO | 2007028596 | 3/2007 |
| WO | 2007060017 | 5/2007 |
| WO | 2008101714 | 8/2008 |
| WO | 2011124352 | 10/2011 |
| WO | 2012041464 | 4/2012 |
| WO | 2012112894 | 8/2012 |
| WO | 2012151288 | 11/2012 |
| WO | 2013032949 | 3/2013 |
| WO | 2015043769 | 4/2015 |

OTHER PUBLICATIONS

International Search Report for Corresponding WO Application No. PCT/EP2014/002656 dated Jan. 9, 2015.

Office Action dated Dec. 5, 2016, with translation thereof, for corresponding Chinese patent application No. 201480064651.5.

Zhang, "Design of a High Brightness Multi-Electron-Beam Source", Available online at WWW.sciencedirect.com, Physics Procedia 1 (2008) 553-563, Jul. 9, 2008, pp. 553-563.

* cited by examiner

CHARGED PARTICLE BEAM SYSTEM AND METHOD OF OPERATING THE SAME

FIELD

The present disclosure relates to charged particle beam systems and methods of operating charged particle beam systems in which a plurality of particle beamlets are directed onto an object surface.

BACKGROUND

A conventional charged particle beam system in which a plurality of particle beamlets is directed onto an object is known from WO 2005/024881. The system is an electron microscope in which a plurality of primary electron beamlets are focused in parallel to form an array of primary electron beam spots on the object. Secondary electrons generated by the primary electrons and emanating from respective primary electron beam spots are received by a charged particle imaging optics to form a corresponding array of secondary electron beamlets which are supplied to an electron detection system having an array of detection elements such that each secondary electron beamlet is incident on a separate detection element. Detection signals generated from the detection elements are indicative of properties of the object at those locations where the primary electron beam spots are formed.

By scanning the array of primary electron beam spots across the object surface, it is possible to obtain an electron microscopic image of the object. It is desirable to obtain images at a high resolution and a high throughput. For this purpose it is desirable to achieve small primary electron beam spots on the object and to be able to scan the primary electron beam spots rapidly across the object surface.

Additional prior art is disclosed in U.S. Pat. No. 7,960,697 B2.

SUMMARY

The present invention has been accomplished taking the above problems into consideration.

Embodiments of the invention provide a method of operating a charged particle system, wherein the method comprises: extracting a particle beam from a source; performing a first accelerating of the particles of the beam; forming a plurality of particle beamlets from the beam after the performing of the first accelerating; performing a second accelerating of the particles of the beamlets; performing a first decelerating of the particles of the beamlets after the performing of the second accelerating; deflecting the beamlets in a direction oriented transverse to a direction of propagation of the particles of the beamlets after the performing of the first decelerating; performing a second decelerating of the particles of the beamlets after the deflecting of the beamlets; and allowing the particles of the beamlets to be incident on an object surface after the performing of the second decelerating.

Other embodiments of the invention provide a method of operating a charged particle system, wherein the method comprises: extracting a particle beam from a source; performing a first accelerating of the particles of the beam; forming a plurality of particle beamlets from the beam after the performing of the first accelerating; performing a first decelerating of the particles of the beamlets; performing a second accelerating of the particles of the beamlets after the performing of the first decelerating; deflecting the beamlets in a direction oriented transverse to a direction of propagation of the particles of the beamlets after the performing of the first decelerating; performing a second decelerating of the particles of the beamlets after the deflecting of the beamlets; and allowing the particles of the beamlets to be incident on an object surface after the performing of the second decelerating.

Further embodiments of the invention provide a method of operating a charged particle system, wherein the method comprises: extracting a particle beam from a source; performing a first accelerating of the particles of the beam; performing a second accelerating of the particles of the beam after performing the first accelerating; performing a first decelerating of the particles of the beam after the performing of the second accelerating; forming a plurality of particle beamlets from the beam after the performing of the first decelerating; deflecting the beamlets in a direction oriented transverse to a direction of propagation of the particles of the beamlets; performing a second decelerating of the particles of the beamlets after the deflecting of the beamlets; and allowing the particles of the beamlets to be incident on an object surface after the performing of the second decelerating.

Still further embodiments of the invention provide a method of operating a charged particle system, wherein the method comprises: extracting a particle beam from a source; performing a first accelerating of the particles of the beam; performing a first decelerating of the particles of the beam after performing the first accelerating; performing a second accelerating of the particles of the beam after the performing of the first decelerating; forming a plurality of particle beamlets from the beam after the performing of the second accelerating; deflecting the beamlets in a direction oriented transverse to a direction of propagation of the particles of the beamlets; performing a second decelerating of the particles of the beamlets after the deflecting of the beamlets; and allowing the particles of the beamlets to be incident on an object surface after the performing of the second decelerating.

The accelerating and decelerating can be achieved by distributing a plurality of electrodes along a path of the beam and the beamlets, respectively, wherein suitably selected voltages are supplied to the electrodes such that electric fields are generated between adjacent electrodes. The particles are accelerated and decelerated, respectively, by these electric fields. The electrodes may have a configuration of a plate oriented transverse to the direction of the beam and the beamlets, respectively, wherein the plate is provided with an aperture allowing the particles to traverse the electrode.

The plurality of particle beamlets can be formed, for example, by a plate oriented transverse to the beam direction such that the beam is incident on the plate. A plurality of apertures are formed in the plate such that particles of the beam traversing the apertures form the plurality of beamlets downstream of the plate.

The deflecting of the beamlets is performed in order to scan the locations of incidence of the beamlets on the object surface across the surface.

According to some embodiments, the deflecting is achieved by operating a magnetic deflector generating time-varying deflection fields by supplying time-varying electric currents to coils generating the magnetic fields.

According to other exemplary embodiments, the deflection is achieved by electrostatic deflectors generating time-varying electric deflection fields, wherein time-varying electric voltages are supplied to electrodes of the deflector. Since the deflection is performed after the performing of the first decelerating of the particles, the kinetic energy of the particles is relatively low such that electrostatic deflectors can be successfully used for achieving a desired amount of deflection. Electrostatic deflectors have an advantage over magnetic deflectors in that the generated deflection fields can be readily changed at very high rates, allowing for rapid scanning of the beamlets across the object surface.

The second decelerating of the particles is performed in order to adjust a kinetic energy at which the particles are incident on the object surface. Typically, this kinetic energy changes from application to application and is sufficiently low to avoid damages of the object during the irradiation with the particle beamlets, or to improve a contrast of a detected image. For example, the kinetic energy with which the electrons are incident on the object surface can be adjusted to operate at the neutral point of the electron yield at which, on the average, each incident electron causes one electron to leave the object surface such that a significant charging of the object surface does not occur. However, the particles travel at significantly higher kinetic energy through the particle beam system before the second decelerating is performed. The higher kinetic energies reduce the total time necessary for the particles to traverse the system such that the Coulomb interaction between the particles does not unnecessarily increase a diameter of the particle beam spots formed on the object surface. A high spatial resolution can be achieved, accordingly.

Further embodiments of the present invention provide a charged particle beam system comprising: a particle beam source configured to generate a particle beam wherein the particle beam source includes a particle emitter; a first electrode downstream of the particle beam source; a multi-aperture plate downstream of the first electrode; a second electrode downstream of the multi-aperture plate; a third electrode downstream of the multi-aperture plate; a deflector downstream of the third electrode; an objective lens downstream of the deflector; a fourth electrode downstream of the deflector; and an object mount configured to mount an object such that a surface of the object is located downstream of the objective lens; a voltage supply configured to maintain the particle emitter at a first voltage; the first electrode and/or the multi-aperture plate at a second voltage; the second electrode at a third voltage; the third electrode at a fourth voltage; the fourth electrode at a fifth voltage; and object mount at a sixth voltage; wherein an absolute value of a first difference between the first voltage and the second voltage is greater than a first voltage amount; an absolute value of a second difference between the second voltage and the third voltage is greater than the first voltage amount; an absolute value of a third difference between the third voltage and the fourth voltage is greater than the first voltage amount; an absolute value of a fourth difference between the fourth voltage and the fifth voltage or the sixth voltage is greater than the first voltage amount; the first difference and the second difference have a same sign; the third difference and the fourth difference have a same sign; and the first difference and the third difference have opposite signs.

Other embodiments of the present invention provide a charged particle beam system comprising: a particle beam source configured to generate a particle beam wherein the particle beam source includes a particle emitter; a first electrode downstream of the particle beam source; a multi-aperture plate downstream of the first electrode; a second electrode downstream of the multi-aperture plate; a third electrode downstream of the multi-aperture plate; a deflector downstream of the third electrode; an objective lens downstream of the deflector; a fourth electrode downstream of the deflector; and an object mount configured to mount an object such that a surface of the object is located downstream of the objective lens; a voltage supply configured to maintain the particle emitter at a first voltage; the first electrode and/or the multi-aperture plate at a second voltage; the second electrode at a third voltage; the third electrode at a fourth voltage; the fourth electrode at a fifth voltage; and object mount at a sixth voltage; wherein an absolute value of a first difference between the first voltage and the second voltage is greater than a first voltage amount; an absolute value of a second difference between the second voltage and the third voltage is greater than the first voltage amount; an absolute value of a third difference between the third voltage and the fourth voltage is greater than the first voltage amount; an absolute value of a fourth difference between the fourth voltage and the fifth voltage or the sixth voltage is greater than the first voltage amount; the first difference and the second difference have a same sign; the second difference and the fourth difference have a same sign; and the first difference and the second difference have opposite signs.

Further embodiments of the present invention provide a charged particle beam system comprising: a particle beam source configured to generate a particle beam wherein the particle beam source includes a particle emitter; a first electrode downstream of the particle beam source; a second electrode downstream of the first electrode; a third electrode downstream of the second electrode; a multi-aperture plate downstream of the third electrode; a deflector downstream of the third electrode; an objective lens downstream of the deflector; a fourth electrode downstream of the deflector; and an object mount configured to mount an object such that a surface of the object is located downstream of the objective lens; a voltage supply configured to maintain the particle emitter at a first voltage; the first electrode and/or the second electrode at a second voltage; the third electrode at a third voltage; the multi-aperture plate at a fourth voltage; the fourth electrode at a fifth voltage; and object mount at a sixth voltage; wherein an absolute value of a first difference between the first voltage and the second voltage is greater than a first voltage amount; an absolute value of a second difference between the second voltage and the third voltage is greater than the first voltage amount; an absolute value of a third difference between the third voltage and the fourth voltage is greater than the first voltage amount; an absolute value of a fourth difference between the fourth voltage and the fifth voltage or the sixth voltage is greater than the first voltage amount; the first difference and the second difference have a same sign; the third difference and the fourth difference have a same sign; and the first difference and the third difference have opposite signs.

Still further embodiments of the present invention provide a charged particle beam system comprising: a particle beam source configured to generate a particle beam wherein the particle beam source includes a particle emitter; a first electrode downstream of the particle beam source; a second electrode downstream of the first electrode; a multi-aperture plate downstream of the second electrode; a deflector downstream of the third electrode; an objective lens downstream of the deflector; a third electrode downstream of the deflector; and an object mount configured to mount an object such that a surface of the object is located downstream of the objective lens; a voltage supply configured to maintain the particle emitter at a first voltage; the first electrode at a second voltage; the second electrode at a third voltage; the multi-aperture plate at a fourth voltage; the third electrode at a fifth voltage; and object mount at a sixth voltage; wherein an absolute value of a first difference between the first voltage and the second voltage is greater than a first voltage amount; an absolute value of a second difference between the second voltage and the third voltage is greater than the first voltage amount; an absolute value of a third difference between the third voltage and the fourth voltage is greater than the first voltage amount; an absolute value of a fourth difference between the fourth voltage and the fifth voltage or the sixth voltage is greater than the first voltage amount; the first difference and the third difference have a same sign; the second difference and the fourth difference have a same sign; and the first difference and the second difference have opposite signs.

The first voltage difference between the particle emitter and the first electrode is selected such that the particles are accelerated. When the particles are electrons, the particle emitter is commonly referred to as a cathode, and the voltage applied to the cathode is lower than the voltage applied to the first electrode, which is then commonly referred to as an anode.

The second voltage difference between the voltage applied to the first electrode and the voltage applied to the second electrode is selected such that the particles are accelerated. The third voltage difference between the voltage applied to the second electrode and the voltage applied to the third electrode is selected such that the particles are decelerated, and the fourth voltage difference between the voltage applied to the third electrode and the voltage applied to the fourth electrode is selected such that the particles are decelerated. A voltage difference between the particle emitter and the object mount determines the landing energy of the particles, i.e. the kinetic energy at which the particles are incident on the object surface.

Absolute values of the first, second, third and fourth voltage differences can be greater than 10 kV, greater than 20 kV or greater than 30 kV.

Similarly, the first and second accelerating of the particles and the first and second decelerating of the particles can increase, or decrease, respectively, the kinetic energy of the particles by more than 10 keV, more than 20 keV or more than 30 keV.

According to some embodiments, the method further comprises performing a first converging of the beam before the deflecting. Since the particle beam extracted from the particle beam source is generally a diverging beam, the first converging may reduce a distance between adjacent particle beam spots on the object surface.

According to exemplary embodiments, the first converging is performed before forming of the plurality of beamlets. According to alternative exemplary embodiments, the first converging is performed after forming of the plurality of beamlets.

According to further exemplary embodiments, the first converging is performed before the deflecting.

According to further embodiments, the converging is performed such that a crossover of the beamlets is formed. Such crossover is a location or region along the beam path where the particle beamlets intersect an optical axis of the system.

According to some embodiments herein, the crossover is formed after the first decelerating and before the second decelerating.

According to further embodiments herein, the method further comprises performing a second converging of the beamlet after the crossover is formed and before the performing of the second decelerating. The first and second converging can be performed such that images of the particle emitter of the source are generated on the substrate surface, resulting in small particle beam spots on the substrate surface.

The first and second converging can be achieved by focusing lenses arranged along the particle beam path. According to some embodiments, the focusing lenses are magnetic lenses generating focusing magnetic fields.

According to some embodiments, the system comprises a first focusing lens downstream of the beam source and upstream of the deflector. According to some embodiments herein, the first focusing lens is positioned upstream of the multi-aperture plate.

According to some embodiments, the method comprises performing a third accelerating of the particles of the beamlets before the crossover is formed. Such third accelerating reduces the traveling time of the particles for traversing the crossover such that an increase of the particle beam spots on the object surface is avoided or significantly reduced.

In some embodiments, a third decelerating is performed after forming of the crossover, such that the kinetic energy of the particles is already reduced before the second converging is performed.

The third accelerating and the third decelerating may change the kinetic energy of the particles by more than 10 keV, more than 20 keV or more than 30 keV.

According to some embodiments, the forming of the plurality of beamlets includes generating of beamlet foci. The beamlet foci are images of a particle emitter of the source, and the these images can be further imaged onto the substrate surface, resulting in small beam spots formed on the substrate surface.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
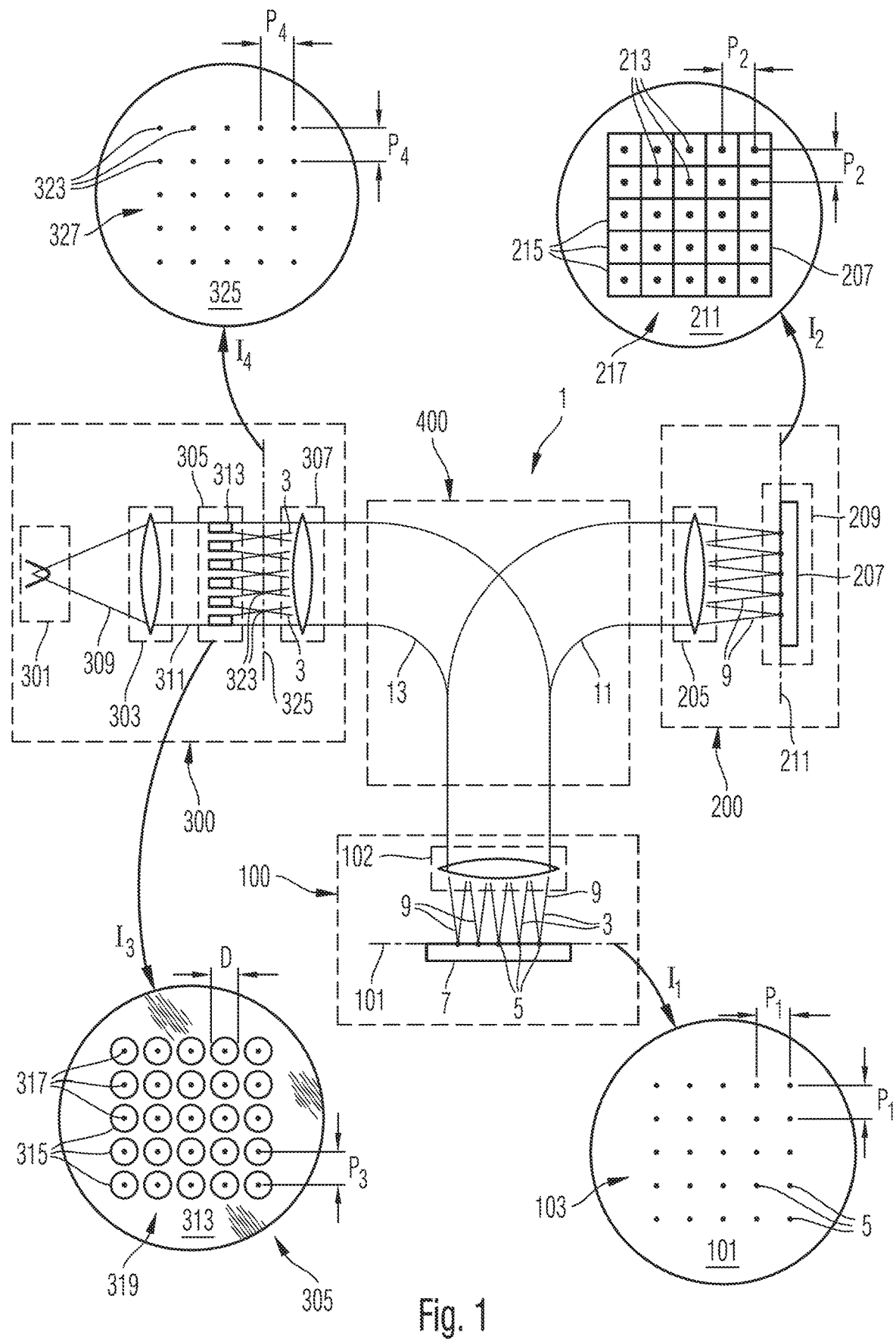
FIG. 1 schematically illustrates basic features and functions of a charged particle beam system.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 is a schematic diagram symbolically illustrating basic functions and features of an inspection system using a plurality of particle beamlets. The inspection system generates a plurality of primary electron beamlets which are incident on a substrate to be inspected to produce secondary electrons emanating from the substrate which are subsequently detected. The inspection system 1 is of a scanning electron microscope type (SEM) using a plurality of primary electron beamlets 3 for generating primary electron beam spots 5 on a surface of the substrate 7 to be inspected. The inspected substrate 7 can be of any type and may comprise, for example, a semiconductor wafer, a biological sample and an arrangement of miniaturized features of other types. The surface of the substrate 7 is arranged in an object plane 101 of an objective lens 102 of an objective lens system 100.

Insert $I_1$ of FIG. 1 shows an elevational view of the object plane 101 with a regular rectangular array 103 of primary electron beam spots 5 formed thereon. In FIG. 1 a number of 25 primary electron beam spots are arranged as a 5×5-array 103. This low number of 25 primary electron beam spots is a low number chosen for ease of illustration in the schematic diagram of FIG. 1. In practice, the number of primary electron beam spots may be chosen substantially higher, such as 20×30, 100×100 and others.

In the illustrated embodiment, the array 103 of primary electron beam spots 5 is a substantially regular rectangular array with a substantially constant pitch $p_1$ between adjacent beam spots. Exemplary values of $p_1$ can be greater than 1 µm, greater than 10 µm, greater than 20 µm or even greater than 50 µm. It is however also possible that the array 103 is a distorted regular array having different pitches in different directions, and the array may also have other symmetries, such as a hexagonal symmetry.

A diameter of the primary electron beam spots formed in the object plane 101 can be small. Exemplary values of such diameter are 1 nm to 5 nm, but they can also be as large as 100 nm or even 200 nm. The focusing of the primary electron beamlets 3 to form the primary electron beam spots 5 is performed by the objective lens system 100.

The primary electrons incident on the substrate 7 at the beam spots 5 produce secondary electrons emanating from the surface of the substrate 7. The secondary electrons emanating from the surface of the substrate 7 are received by the objective lens 102 to form secondary electron beamlets 9. The inspection system 1 provides a secondary electron beam path 11 for supplying the plurality of secondary electron beamlets 9 to a charged particle detection system 200. The detection system 200 comprises a projection lens arrangement 205 for directing the secondary electron beamlets 9 towards a detector 207. The detector is a detector having plural detection elements and may comprise a CCD detector, a CMOS detector, a scintillator detector, a microchannel plate, an array of PIN-diodes, Avalange photodiodes (APD), and others and suitable combinations thereof.

Insert $I_2$ of FIG. 1 shows an elevational view of the detector 207, wherein secondary electron beam spots 213 are formed on individual detection elements 215 which are arranged as an array 217 having a regular pitch $p_2$. Exemplary values of the pitch $p_2$ are 10 µm, 100 µm and 200 µm.

The primary electron beamlets 3 are generated by a beamlet generation system 300 comprising at least one electron source 301, at least one collimating lens 303, a multi-aperture plate arrangement 305 and a field lens 307.

The electron source 301 generates a diverging electron beam 309 which is collimated by collimating lens 303 to form a beam 311 illuminating the multi-aperture arrangement 305.

Insert $I_3$ of FIG. 1 shows an elevational view of the multi-aperture arrangement 305. The multi-aperture arrangement 305 comprises a multi-aperture plate 313 having a plurality of apertures 315 formed therein. Centers 317 of the apertures 315 are arranged in a pattern 319 corresponding to the pattern 103 of the primary electron beam spots 5 formed in the object plane 101. A pitch $p_3$ of array 103 may have exemplary values of 5 µm, 100 µm and 200 µm. Diameters D of the apertures 315 are less than the pitch $p_3$. Exemplary values of the diameters D are $0.2 \cdot p_3$, $0.4 \cdot p_3$ and $0.8 \cdot p_3$.

Electrons of the illuminating beam 311 traversing the apertures 315 form the primary electron beamlets 3. Electrons of illuminating beam 311 impinging on the plate 313 are intercepted by the plate and do not contribute to forming the primary electron beamlets 3.

Moreover, the multi-aperture arrangement 305 focuses the individual electron beamlets 3 such that foci 323 are generated in a plane 325. Insert $I_4$ of FIG. 1 shows an elevational view of plane 325 with foci 323 arranged in a pattern 327. A pitch $p_4$ of pattern 327 may be equal to or different from the pitch $p_3$ of pattern 319 of the multi-aperture plate 313. A diameter of the foci 323 may have exemplary values of 10 nm, 100 nm and 1 µm.

The field lens 307 and the objective lens 102 provide an imaging system for imaging the plane 325 onto the object plane 101 to form the array 103 of primary electron beam spots 5 on the surface of the substrate 7.

A beam splitter system 400 is provided in the primary electron beam path 13 in-between the beam generating system 300 and the objective lens system 100. The beam splitter system 400 is also part of the secondary electron beam path 11 such that the beam splitter system 400 is located in-between the objective lens system 100 and the detection system 200.

Background information relating to such beamlet inspection system and charged particle components used therein, such as charged particle sources, multi-aperture plates and lenses may be obtained from WO 2005/024881, WO 2007/028595, WO 2007/028596 and WO 2007/060017 wherein the full disclosure of these applications is incorporated herein by reference.

Figure 2:
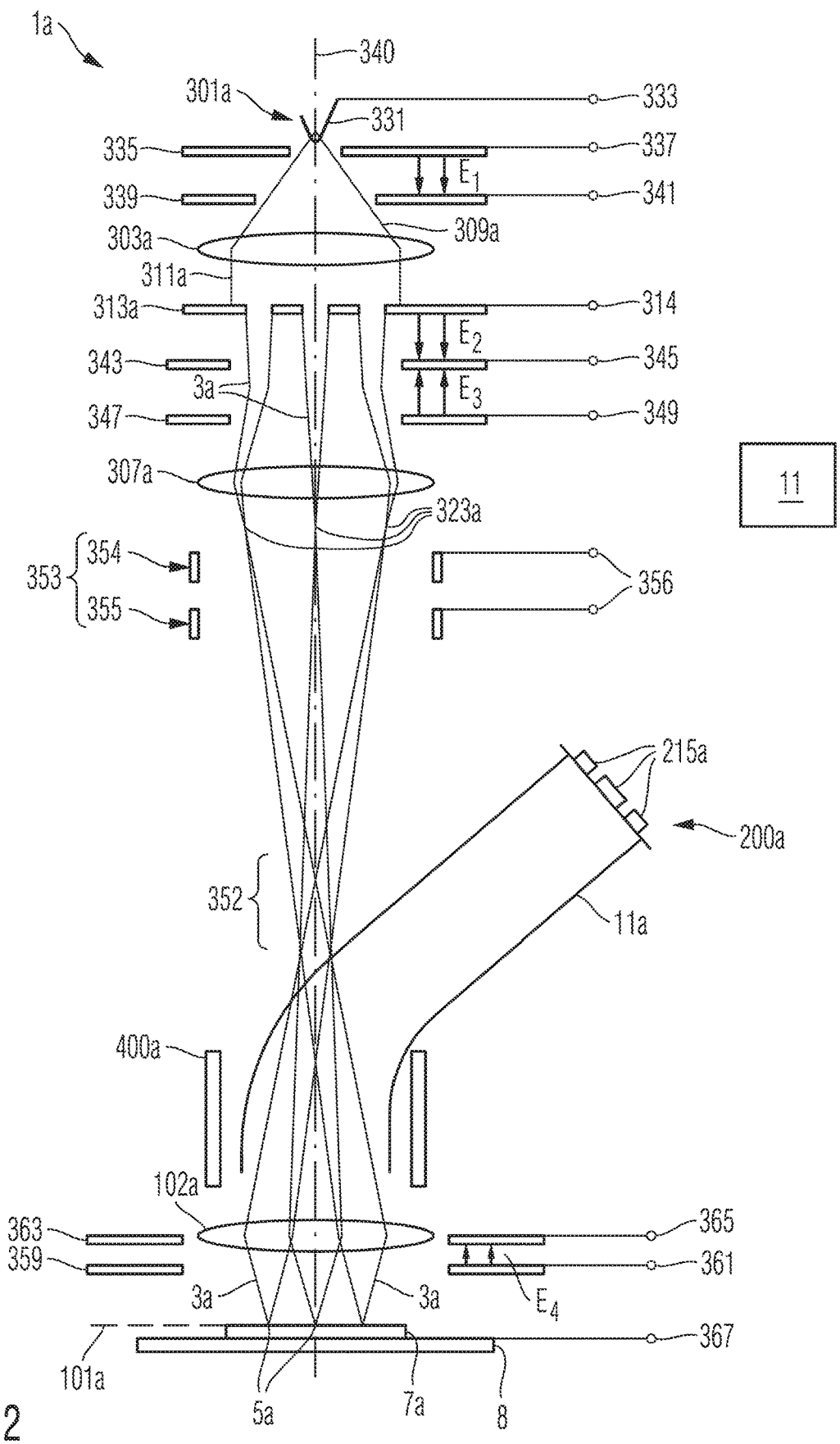
FIG. 2 schematically illustrates particle beam paths in a charged particle beam system according to a first embodiment.

FIG. 2 is a schematic illustration of a charged particle beam system 1a in which a plurality of charged particle beamlets 3a are directed onto a surface of an object 7a mounted on an object mount 8. In the illustration of FIG. 2, the number of particle beamlets 3a is three. This low number has been chosen for illustration purposes only, and the number of particle beamlets used in practice can be significantly higher, as already mentioned above. Moreover, the diameter of the beamlets is exaggerated relative to the length of the total beam path between a charged particle source 301a and the surface of the object 7a.

The particle beam source 301a comprises a particle beam emitter 331 which is also referred to as a cathode, since the particles emitted from the particle emitter 331 are electrons. The particle beam source 301a comprises at least one connector 333 connecting the emitter 331 to a controller 11 of the system 1a. The controller 11 supplies a heating current and other necessary signals to the emitter 331 and maintains the emitter 331 at a predefined electric potential by supplying a first voltage V1 to the emitter 331.

The beam source 301a further comprises an extractor electrode 335 connected via a connector 337 to the controller 11. The controller 11 maintains the extractor electrode 335 at a suitable voltage relative to the voltage V1 of the emitter 331 such that a diverging particle beam 309a is extracted from the emitter 331.

A first electrode 339 is located downstream of the particle source 301a along a beam path of the particle beam 309a. The first electrode 339 is configured as a plate oriented orthogonal to an optical axis 340 along which the particle beam 309a propagates. The plate has a circular aperture centered on the optical axis 340 and traversed by the beam 309a. The first electrode 339 is connected via a connector 341 with the controller 11 which supplies a second voltage V2 to the first electrode.

A voltage difference between the first voltage V1 and the second voltage V2 and a voltage difference between the voltage applied to the extractor 335 and the second voltage V2 are selected such that the particles of the particle beam 309a are accelerated after the extraction from the particle source 301a. Two arrows between the electrodes 335 and 339 in FIG. 2 represent an accelerating electric field E1 generated between the electrodes 335 and 339 and which accelerates the particles. A focusing condenser lens 303a is located downstream of the first electrode 339. The condenser lens 303a can be a magnetic lens which is energized by the controller such that the diverging beam 309 is converged to form a parallel beam 311a.

A multi-aperture plate 313a is positioned downstream of the condenser lens 303a. The multi-aperture plate 313a has a plurality of apertures which are traversed by the particles of the beam 311a such that particle beamlets are generated downstream of the multi-aperture plate 313a. The multi-aperture plate 313a is connected, via a connector 315, to the controller 11, and the controller 11 maintains the multi-aperture plate 313 at a suitable voltage. In the present example, this voltage is equal to the second voltage V2 applied to the first electrode 339, such that no accelerating or decelerating electric fields are generated between the electrode 339 and the multi-aperture plate 313a, and the kinetic energy at which that particles of the beam 311a are incident on the multi-aperture plate 313a is the kinetic energy to which the particles have been accelerated after traversing the electric field E1.

A second electrode 343 is positioned downstream of the multi-aperture plate 313a. The second electrode 343 is configured similar to the first electrode 339 and is formed of a plate having a circular aperture centered at the optical axis 340 and of a size such that all beamlets formed by the multi-aperture plate 313 can traverse the aperture. The second electrode 343 is connected, via a connector 345, to the controller 11 and maintained by the controller at a third voltage V3. The third voltage V3 is selected such that an accelerating electric field E2 is generated between the multi-aperture plate 313a and the second electrode 343. The electric field E2 generated downstream and adjacent to the apertures of the multi-aperture plate accelerates the particles of the beamlets having traversed the apertures of the multi-aperture plate 313a and has a function of focusing the particle beamlets having traversed the multiple apertures such that beamlet foci 323a are formed downstream of the multi-aperture plate 313a.

A third electrode 347 is positioned downstream of the second electrode 343. The third electrode 347 is formed of a plate having an aperture traversed by the beamlets 3a and is connected to the controller 11 via a connector 349. The controller 11 maintains the third electrode 347 at a fourth voltage V4 selected such that a decelerating electric field E3 is generated between the second electrode 343 and the third electrode 347. The electric field E3 decelerates the particles of the beamlets such that their kinetic energies are significantly reduced. Further, the electric field E3 produced between the second and third electrodes 343 and 347 has a function of a diverging particle optical lens, such that adjacent beamlet foci 323a have a greater distance from each other than adjacent centers of the apertures of the multi-aperture plate 313a. In the present example, the voltage V4 is 0 V such that the third electrode 347 is at ground potential. However, other voltages can be applied to the third electrode 347 in order to generate a decelerating electric field E3 upstream of the third electrode 347. The ground potential is the potential of major components of the system, such as a vacuum vessel enclosing the particle beam path. The ground potential at this portion of the beam path provides advantages regarding the mechanical design since insulators are not required, and it provides advantages for the electrostatic scanning system.

A focusing, lens 307a is positioned downstream of the third electrode 347. The focusing lens 303a can be a magnetic lens. The focusing lens 307a has a function of a field lens and converges the particle beamlets such that a crossover of the bundle of the particle beamlets 3a is formed in a region 352 downstream of the field lens 307a. In the present example, the field lens 307a is positioned upstream of the beamlet foci 323a. However, the beamlet foci 323a can also be formed upstream of the field lens 307a or within the field lens. The beamlet foci 323a can be even formed upstream of the third electrode 347.

A deflector arrangement 353 is located downstream of the field lens 307a. The deflector 353 has a function of deflecting the particle beamlets 3a such that the locations of incidence 5a of the beamlets 3a on the surface of the object 7a can be changed. The deflector arrangement 353 comprises a first deflector 354 and a second deflector 355 positioned downstream of the first deflector 354. The deflector arrangement 353 comprises two deflectors 354 and 355 to be able to simultaneously adjust the position of the location of incidence of the beamlets on the object surface and the landing angle of the beamlets on the object surface. Each of the deflectors 354, 355 comprises plural pairs of electrodes positioned on opposite sides of the optical axis 340. The electrodes are connected, via respective connectors 356, to the controller 11. The controller 11 can apply different voltages to the electrode pairs such that deflecting electric fields oriented orthogonal to the optical axis 340 are generated between the pairs of electrodes. Time-varying voltages can be applied to the deflectors 354, 355 in order to scan the array of particle beam spots 5a across the surface of the object 7a.

A focusing objective lens 102a is located downstream of the crossover 352 and has a function of focusing the particle beamlets 3a onto the surface of the object 7a such that small beam spots 5a are generated on the object surface.

A further electrode 359 is positioned upstream of the surface of the object and has an aperture traversed by the particle beamlets 3a. The electrode 359 can be integrated with components of the objective lens 102a. For example, a pole piece of the objective lens may form the electrode 359. However, it is also possible to provide the electrode 359 as a separate element. The fourth electrode 359 is connected, via a connector 361 to the controller 11. The controller supplies a fifth voltage V5 to the fourth electrode 359 such that a decelerating electric field E4 is generated upstream of the fourth electrode 359. The decelerating electric field E4 is generated between the fourth electrode 359 and a further electrode 363 positioned upstream of the fourth electrode 359 and connected, via a connector 365, to the controller 11. The controller 11 supplies a voltage to the further electrode 363 selected such that the field generated between the electrodes 363 and 359 is decelerating to the particles of the beamlets 3a. In the present example, the voltage applied to the further electrode 363 is the fourth voltage V4 also applied to the third electrode 347, such that the particles are maintained at a constant kinetic energy when they traverse the field lens 351, the deflector 353, the crossover 352 and a beam splitter 400a illustrated in more detail below.

The further electrode 363 can be integrated with components of the objective lens 102a. For example, pole pieces of the objective lens 102a can provide the further electrode 363. However, it is also possible that the further electrode 363 is provided by an element separate from the objective lens 102a.

The object mount 8 is connected, via a connector 367, to the controller 11, and the controller 11 supplies a sixth voltage V6 to the object mount 8. The inspected object 7a is electrically connected to the object mount 8 and has a sufficient conductivity such that also the surface of the object 7a is maintained substantially at the voltage V6. The difference between the sixth voltage V6 and the first voltage V1 at which the particle emitter is maintained substantially determines the landing energy of the particles on the object 7a, i.e. the kinetic energy at which the particles are incident on the surface of the object 7a. In this context, it is to be noted that the landing energy is further influenced by charges locally accumulated on the object surface. In some embodiments, the sixth voltage V6 is selected such that it is equal to the fifth voltage V5 of the fourth electrode 359 positioned upstream of the object surface, such that the particles are not further accelerated or decelerated between the fourth electrode 359 and the object 7a.

The particles of the particle beamlets 3a incident on the object 7a at the beam spots 5a generate secondary particles, such as backscattered electrons and secondary electrons, which emanate from the object surface. These secondary particles may traverse the fourth electrode 359 and are then accelerated in the electric field E4 such that they gain a significant amount of energy in order to traverse the objective lens 102a. A beam 11a formed from the secondary particles is then separated from the beamlets 13a of the primary particles in a beam splitter 400a. The beam splitter 400a directs the secondary particles towards a detector arrangement 200a including one detection element 215a for each primary particle beam spot 5a.

Various voltages can be supplied to the emitter 331, the first electrode 339, the second electrode 343, the third electrode 347 and the fourth electrode 359 such that the electric field E1 provided upstream of the multi-aperture plate 313a is accelerating, the electric field E2 provided downstream of the multi-aperture plate 313a, i.e. the forming of the plurality of beamlets, is accelerating to the particles, and the electric field E3 provided downstream of the accelerating electric field E2 is decelerating and the electric field E4 provided downstream of the deflector arrangement 353 and after the deflecting of the particles is decelerating to the particles. According to one example, the voltage V1 applied to the emitter 331 is a negative high voltage HV, the voltage V2 applied to the first electrode 339 is 0 V, i.e. ground potential, the voltage V3 applied to the second electrode 343 is a positive high voltage HV, the voltage V4 applied to the third electrode 347 is 0 V, i.e. ground potential, and the voltage V5 applied to the fourth electrode 359 is the negative high voltage HV, wherein the voltage V6 applied to the object mount 8 can be also the negative high voltage HV or suitably higher in order to adjust the landing energy of the particles on the object surface to a desired value.

The high voltage HV can be, for example, 10 kV, 20 kV or 30 kV.

Figure 3:
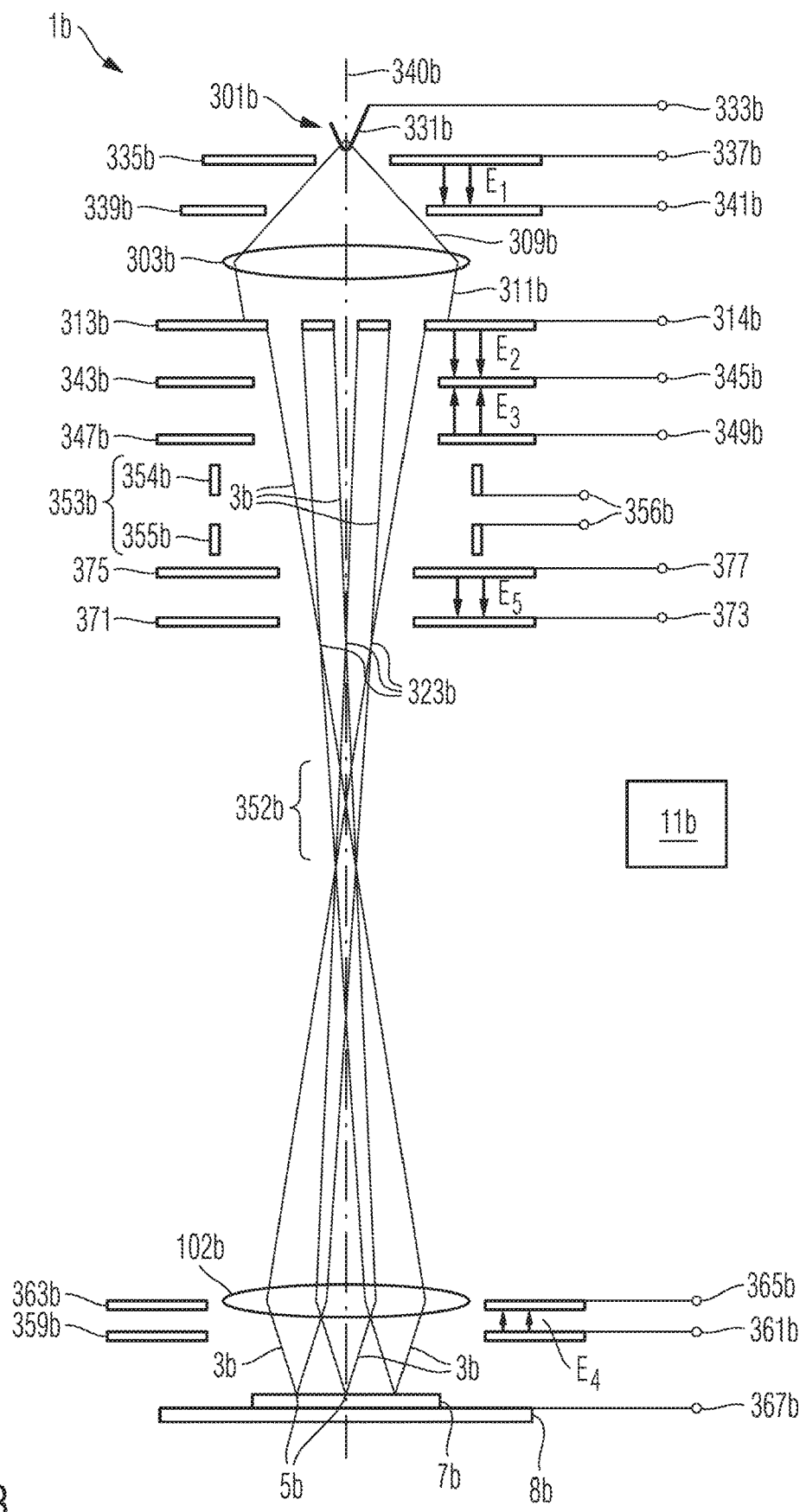
FIG. 3 schematically illustrates particle beam paths in a charged particle beam system according to a second embodiment.

FIG. 3 is a schematic illustration of a further charged particle beam system 1b in which a plurality of charged particle beamlets 3b are directed onto a surface of an object 7b mounted on an object mount 8b. The charged particle beam system 1b has a configuration similar to the configuration of the system illustrated with reference to FIG. 2 above. For example, a divergent particle beam 309b is extracted from the particle source 301b and accelerated by an electric field E1 generated between an extractor electrode 335b and a first electrode 339b. The divergent beam 309b is converged by a focusing condenser lens 303b. While the converged beam downstream of the first focusing or condenser lens was a parallel beam in the embodiment illustrated with reference to FIG. 2 above, the converged beam 311b of the present example is a converging beam incident on a multi-aperture plate 313b provided for forming a plurality of particle beamlets. The particles of the particle beamlets are accelerated by an electric field E2 provided between the multi-aperture plate 313b and a second electrode 343b, such that beamlet foci 323b are generated downstream of the second electrode 343b. A decelerating electric field E3 is provided between the second electrode 343b and a third electrode 347b subsequent to the accelerating field E2. After the deceleration in the electric field E3, the particle beamlets traverse a deflector arrangement 353b, form a crossover 352b and are converged in a focusing objective lens 102b such that beam spots 5b are formed on the surface of the object 7b from the particle beamlets 3b. Further, a decelerating electric field E4 is provided upstream of the object surface between a fourth electrode 359b and a further electrode 363b.

The system 1b differs from the system illustrated with reference to FIG. 2 above in that a field lens is not provided in a region where the beamlet foci 323b are formed. However, the condenser lens 303b is energized such that the particle beam 311b from which the plurality of beamlets are formed is a converging beam such that the crossover 352b is formed downstream of the beamlet foci 323b.

The system 1b further differs from the system illustrated with reference to FIG. 2 above in that a fifth electrode 371 is located downstream of the deflector arrangement 353b and upstream of the crossover 352b. The fifth electrode 371 has an aperture traversed by the particle beamlets and is connected, via a connector 373, to a controller 11b, which supplies a seventh voltage V7 to the fifth electrode 371. The seventh voltage V7 is selected such that an accelerating electric field E5 is generated upstream of the fifth electrode 371 in order to accelerate the particles of the beamlets such that they traverse the region of the crossover 352b in a shorter time for avoiding an increase of the beam spots 5b formed on the object surface due to Coulomb interaction. The accelerating electric field E5 is generated between the fifth electrode 371 and a further electrode 375 provided upstream of the fifth electrode 371. The further electrode 375 is connected, via a connector 377, to the controller 11b. A suitable voltage can be supplied to the further electrode 375 such that the electric field E5 generated between the further electrode 375 and the fifth electrode 371 is accelerating to the particles. In the present example, the voltage supplied to the further electrode 375 is equal to the fourth voltage V4 supplied to the third electrode 347b provided upstream of the deflector arrangement 353b. As in the previous example, the voltage V4 can be 0 V, i.e. ground potential, such that the deflector arrangement 353b can be operated at ground potential, enabling the use of an electrostatic scan deflector not requiring a static high voltage offset added to the dynamic scan voltage. It is then advantageous to embody the deflector arrangement 353b as an electrostatic deflector in which deflecting electric fields are generated by electrodes 354b, 355b located at opposite sides of the optical axis 340b.

Figure 4:
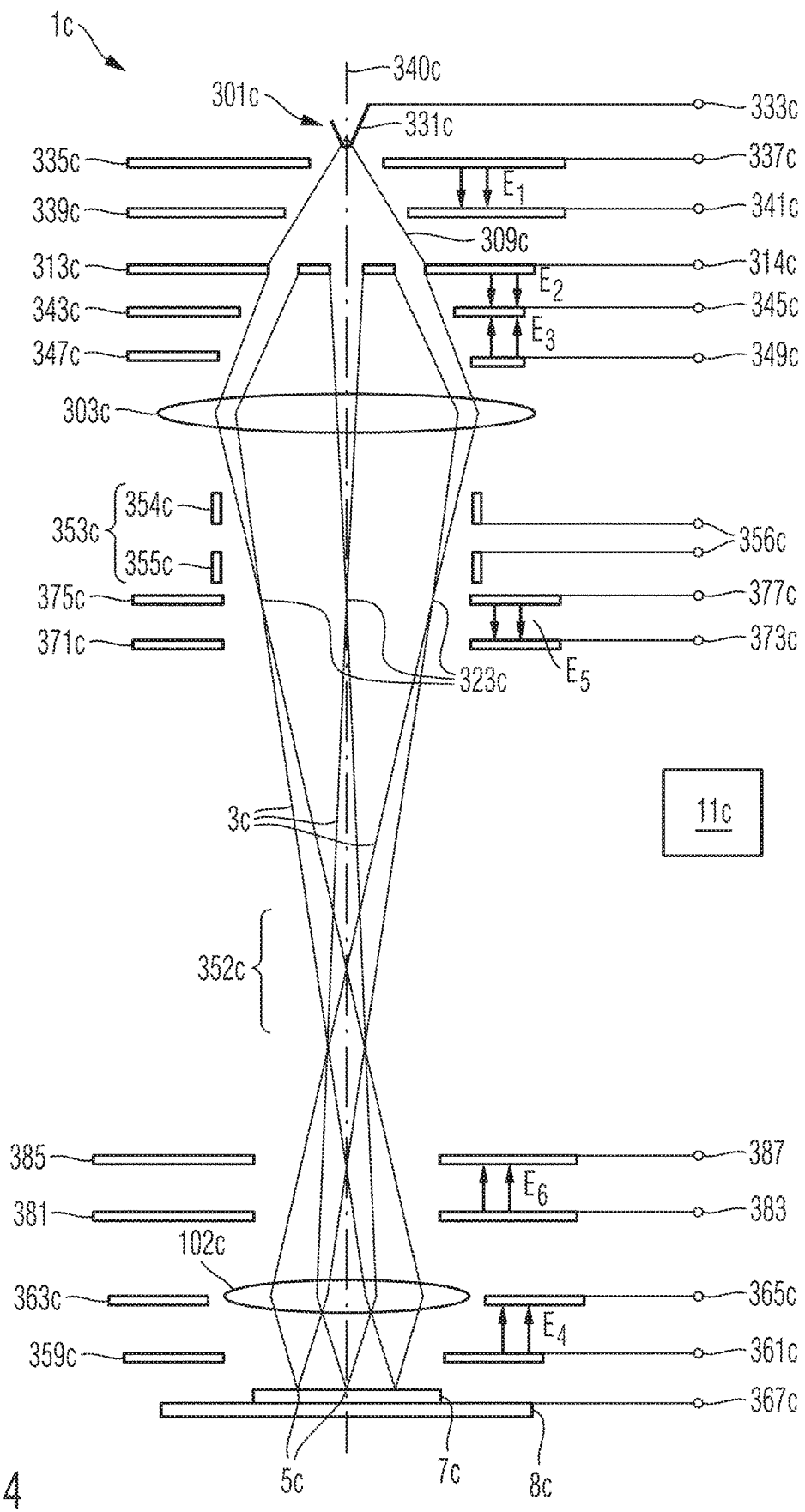
FIG. 4 schematically illustrates particle beam paths in a charged particle beam system according to a third embodiment.

This advantage does not only apply to the embodiment shown in FIG. 3 with a convergent beam at the multi-aperture plate but to the same extent also applies to embodiments with parallel beam paths or divergent beam paths at the multi-aperture plate as shown in FIGS. 2 and 4.

The voltage V1 applied to the particle emitter 331b, the voltage V2 applied to the first electrode 339b, the third voltage V3 applied to the second electrode 343b, the fourth voltage V4 applied to the third electrode 347b, the fifth voltage V5 applied to the fourth electrode 359b and the sixth voltage V6 applied to the object mount 8b can be selected as illustrated above with reference to FIG. 2.

FIG. 4 is a schematic illustration of a further charged particle beam system 1c in which a plurality of charged particle beamlets 3c are directed onto a surface of an object 7c mounted on an object mount 8c. The charged particle beam system 1c has a configuration similar to the configuration of the system illustrated with reference to FIG. 3 above. In particular, a divergent particle beam 309c is extracted from the particle source 301c and accelerated by an electric field E1 generated between an extractor electrode 335c of the particle source 301c and a first electrode 339c. While the divergent beam extracted from the source is converged by a condenser lens before the plurality of particle beamlets are formed in the example illustrated with reference to FIG. 3 above, it is the divergent beam 309c extracted from the source 301c which is incident on a multi-aperture plate 313c in order to form the plurality of particle beamlets in the system 1c. Since the beam 309c incident on the multi-aperture plate 313c is a divergent beam, the particle beamlets formed downstream of the multi-aperture plate 313c also diverge from each other. A focusing condenser lens 303c is positioned downstream of the multi-aperture plate 313c such that the particle beamlets converge relative to each other downstream of the condenser lens 303c and form a crossover 352c before they are focused by an objective lens 102c to form beam spots 5c or a surface of an object 7c.

A second electrode 343c is positioned downstream of the multi-aperture plate 313c and supplied with a voltage V3 such that an accelerating electric field E2 is provided to the particles downstream of the multi-aperture plate 313c such that beamlet foci 323c are formed downstream of the multi-aperture plate 313c.

A third electrode 347c is supplied with a voltage V4 selected such that a decelerating electric field E3 is provided to the particles subsequent to the accelerating electric field E2. As in the previous example, the voltage V4 can be 0 V, i.e. ground potential, such that the condenser lens 303c and a deflector arrangement 353c can be operated at ground potential.

A fourth electrode 359c supplied with a fifth voltage V5 is provided upstream of the object 7c for generating a decelerating electric field E4.

Similar to the example illustrated with reference to FIG. 3 above, a fifth electrode 371c is provided downstream of the deflector 353c for generating an accelerating electric field E5 such that the particles traverse the crossover in a shorter time.

While there is only one decelerating electric field E4 provided upstream of the object in the embodiment illustrated with reference to FIG. 3 above, a further decelerating electric field E6 is generated in the system 1c downstream of the crossover 352c and upstream of a objective lens 102c. The sixth electric field is generated between a sixth electrode 381 located upstream of the objective lens 102c and connected, via a connector 383 to a controller 11c, and a further electrode 385 connected, via a connector 387 to the controller 11c and supplied with a suitable voltage. The voltage supplied to the further electrode 385 can be the same voltage as voltage V7 supplied to the fifth electrode 371c, such that the particles are not accelerated or decelerated while traversing the crossover 352c. However, other voltages can be supplied to the further electrode 385. The voltage V8 can be 0 V, i.e. ground potential, such that the objective lens 102c can be operated at ground potential.

The other voltages V1, V2, V3, V4, V5, V6 and V7 supplied to the various electrodes of system 1c can be selected similarly as illustrated above with reference to FIGS. 2 and 3.

In the embodiment shown in FIG. 2, the crossover 352 of the bundle of beamlets is generated in a region upstream of the beam splitter 400a. However, the crossover can also be generated within or downstream of the beam splitter 400a.

Figure 5:
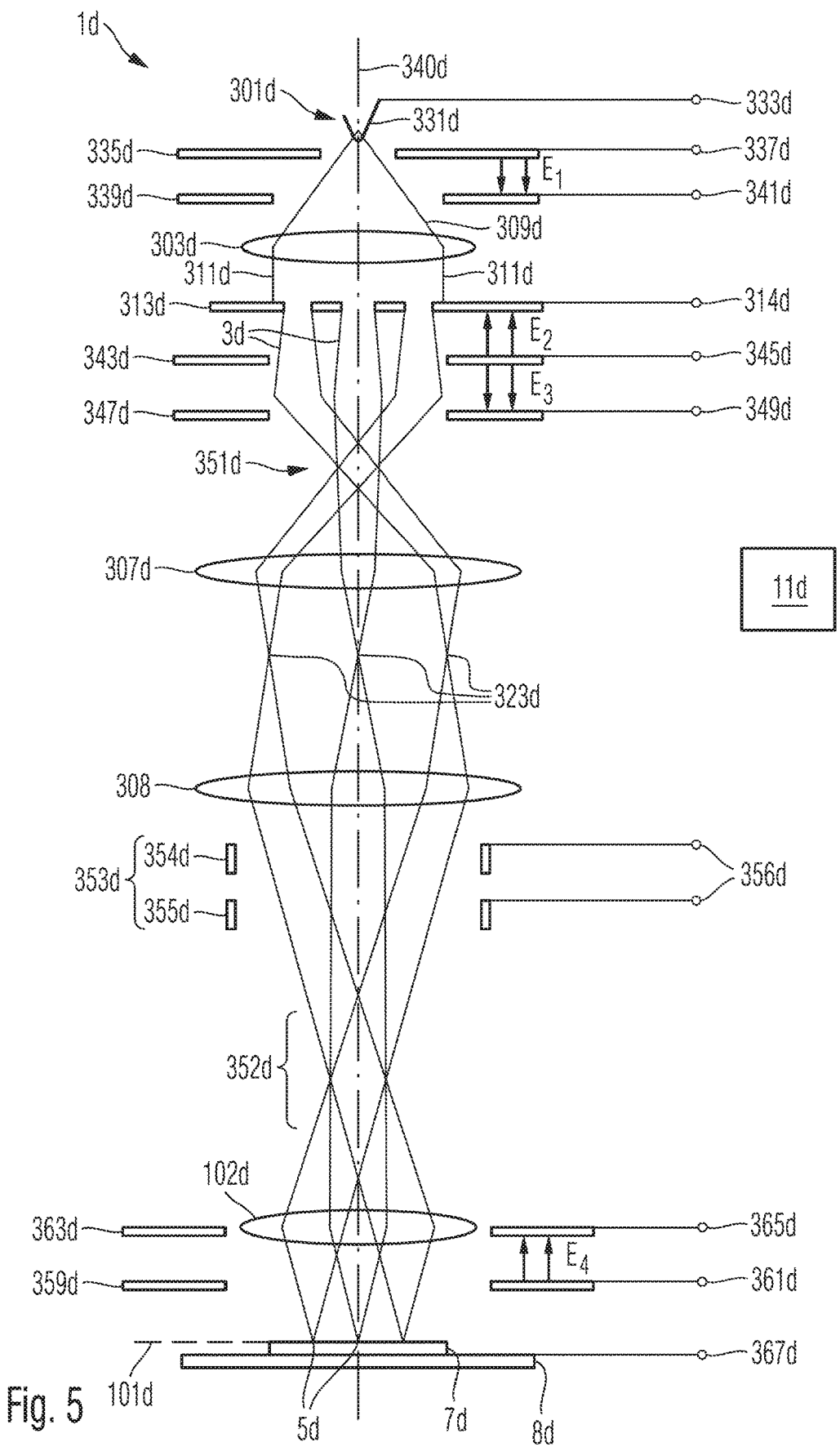
FIG. 5 schematically illustrates particle beam paths in a charged particle beam system according to a fourth embodiment.

FIG. 5 is a schematic illustration of a further charged particle beam system 1d in which a plurality of charged particle beamlets 3d are focused on a surface of an object 7d. The charged particle beam system 1d has a configuration similar to the systems illustrated with reference to FIGS. 2 to 4 above. In particular, a particle emitter 313d of a particle beam source 301d is maintained at a first voltage V1, and a diverging particle beam 309d is extracted from the emitter 331d using an extractor electrode 335d. A first electrode 339d is located downstream of the particle source 301d and maintained at a voltage V2 such that an accelerating electric field E1 is generated between the extractor electrode 335d and the first electrode 339d. A condenser lens 303d, which can be a magnetic lens, is positioned downstream of the first electrode 339d and converges the diverging beam 309d such that a parallel beam 311d is formed.

A multi-aperture plate 313d is positioned within the beam 311d such that a plurality of charged particle beamlets 3d are formed downstream of the multi-aperture plate 313d. A second electrode 343d is positioned downstream of the multi-aperture plate 313d. The second electrode 343d has an aperture traversed by the plurality of beamlets 3d and is maintained at an electric potential V3 such that a decelerating electric field E2 is generated between the multi-aperture plate 313d and the second electrode 343d. In the illustrated example, the multi-aperture plate 313d is maintained at the same electric potential V2 as the first aperture plate 339d. However, other voltages can be applied to the second electrode 313d via the terminal 314d in order to generate the decelerating electric field E2 between the multi-aperture plate 313d and the second electrode 343d. The decelerating electric field E2 generated at the downstream side of the multi-aperture plate 313d has an effect such that the apertures of the multi-aperture plate 313d have a function of diverging lenses on the beamlets 3d such that diverging particle beamlets 3d are formed from the incident parallel beam 311d downstream of the multi-aperture plate 313d.

A third aperture plate 347$d$ traversed by the bundle of the particle beamlets 3$d$ is positioned downstream of the second aperture plate 343$d$. The third aperture plate 347$d$ is maintained at an electric potential V4 selected such that an accelerating electric field E3 is generated between the second aperture plate 343$d$ and the third aperture plate 347$d$. The accelerating field E3 has a focusing function on the particle beamlets such that the bundle of the beamlets 3$d$ forms a crossover 351$d$ and such that the individual diverging beamlets 3$d$ are converged such that beamlet foci 323$d$ are formed downstream of the third aperture plate 347$d$.

A focusing lens 307$d$, which can be a magnetic lens, is positioned downstream of the crossover 351$d$ in order to reduce a divergence of the bundle of the beamlets 3$d$ downstream of the crossover 351$d$. In the present example, the focusing lens 307$d$ has a focusing power selected such that the beamlets 3$d$ propagate parallel to each other downstream of lens 307$d$.

The beamlet foci 323$d$ are imaged onto the surface of the object 7$d$ positioned in an object plane 101$d$ using a further focusing lens 308$d$ and an objective lens 102$d$. The focusing lens 308$d$ and the objective lens 102$d$ can be magnetic lenses.

A further aperture plate 363$d$ and a fourth aperture plate 359$d$ are positioned upstream of the object plane 101$d$. The fourth aperture plate 359$d$ is maintained at a voltage V5 and the further aperture plate 363$d$ is maintained at a suitable voltage selected such that a decelerating electric field E4 is generated between the further aperture plate 363$d$ and the fourth aperture plate 359$d$. In the present example, the voltage applied to the further electrode 363$d$ is equal to the voltage V4 applied to the third aperture plate 347$d$. However, the further electrode 363$d$ can be maintained at under suitable voltages such that the decelerating electric field E4 is generated between the aperture plate 363$d$ and 359$d$.

A further crossover 352$d$ of the bundle of the particle beamlets 3$d$ is formed between the lenses 308 and 102$d$. A deflector arrangement 353$d$ is positioned between the lens 308 and the crossover 352$d$. However, the deflector arrangement 353$d$ can also be located at other positions between the second aperture plate 347$d$ and the object surface 101$d$. Moreover, the focusing power of the lenses 307$d$ and 308 can be combined into one focusing lens.

The voltage V1 can be a negative high voltage, the voltage V3 can be a negative high voltage, the voltage V6 can be negative high voltage, and the voltages V2, V4 and V5 can be voltages close to ground voltage, such that the beam deflector arrangement 353$d$ can be operated close to or at ground voltage. In the illustrated embodiment, the following voltages are selected: V1=30 kV, V2=0 kV, V3=20 kV, V4=0 kV and V6=−29 kV, wherein the voltage V5 is selected such that it is equal to V6 or such that at least a small decelerating field is generated between the aperture plate 359$d$ and the object 7$d$. It is also possible to omit the further aperture plate 363$d$ and to select the voltage V5 such that the decelerating electric field E4 is generated between the fourth aperture plate 359$d$ and the object 7$d$.

Figure 6:
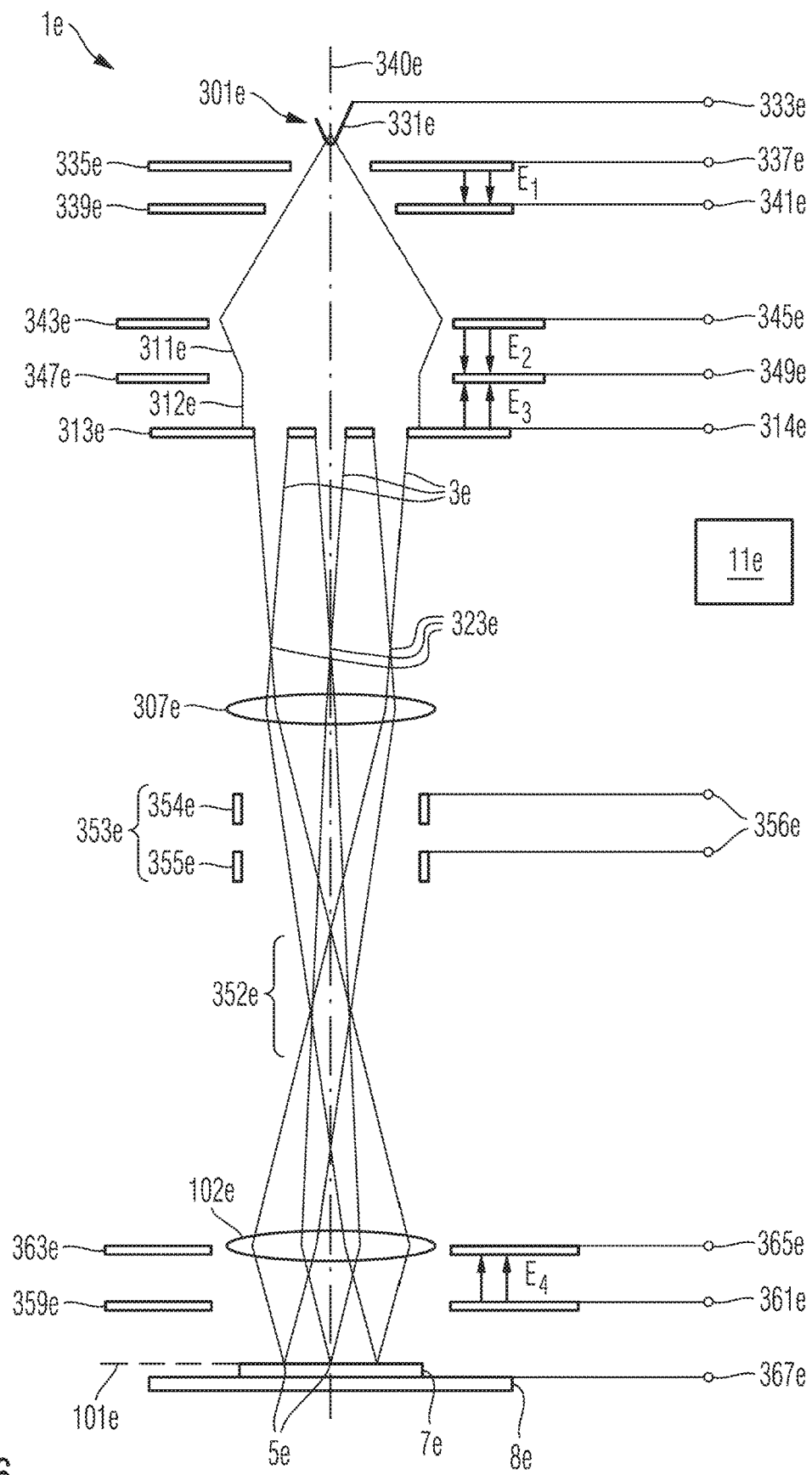
FIG. 6 schematically illustrates particle beam paths in a charged particle beam system according to a fifth embodiment.

FIG. 6 is a schematic illustration of a further charged particle beam system 1$e$ in which a plurality of charged particle beamlets 3$e$ are directed onto a surface of an object 7$e$. The charged particle beam system 1$e$ has a configuration similar to the systems illustrated with reference to FIGS. 2 to 5 above. For example, a divergent particle beam 309$e$ is extracted from a particle source 301$e$ and accelerated by an electric field E1 generated between an extractor electrode 335$e$ and a first electrode 339$e$. A second electrode provided by a second single-aperture plate 343$e$ is positioned in the beam path of the divergent beam 309$e$. A third electrode or aperture plate 347$e$ is positioned downstream of the second aperture plate 343$e$. The third aperture plate 347$e$ is maintained at an electric potential V3 selected such that an accelerating field E2 is generated between the electrodes 343$e$ and 347$e$. The electric voltage supplied to the second aperture plate 343$e$ via a terminal 345$e$ can be equal to the voltage V2, or it can be different from the voltage V2. The accelerating field E2 has a focusing function on the diverging beam 309$e$ such that a converging beam 311$e$ is formed. Additional focusing lenses, such as magnetic focusing lenses, can be positioned between the first and second aperture plates 339$e$, 343$e$ in order to provide additional focusing power on the diverging beam 309$e$.

A multi-aperture plate 313$e$ is positioned downstream of the third aperture plate 347$e$ and maintained at an electric potential V4 such that a decelerating electric field E3 is generated between the third aperture plate 347$e$ and the multi-aperture plate 313$e$. The decelerating electric field E3 has a function of a diverging lens on the converging beam 311$e$ such that a parallel beam 312$e$ is formed which is incident on the multi-aperture plate 313$e$. The apertures provided in the multi-aperture plate 313$e$ allow the particle beamlets 3$e$ to pass through the multi-aperture plate 313$e$. The decelerating electric field E3 generated on the upstream side of the multi-aperture plate 313$e$ has a result that the apertures of the multi-aperture plate 313$e$ perform a focusing function on the particle beamlets 3$e$ generated from the incident parallel beam 312$e$, such that beamlet foci 323$e$ are formed downstream of the multi-aperture plate 313$e$. The beamlet foci 323$e$ are imaged onto the surface of the object 7$e$ positioned at the object plane 101$e$. The components shown in FIG. 6 for this purpose have a similar configuration to the corresponding components of the embodiments illustrated with reference to FIGS. 2 to 5 above and will not be further illustrated in detail here. Reference should be made to the preceding specification, accordingly. It is to be noted that a decelerating field E4 is generated upstream of the object 7$e$ between two electrodes 363$e$ and 359$e$ or between an electrode and the object 7$e$ itself.

The voltage V1 can be a negative high voltage, the voltage V2 can be close to or equal to ground potential, the voltage V3 can be a positive high voltage, the voltage V4 can be close to or equal to ground potential, and the voltage V6 can be a negative high voltage. In the present example, the following voltages are selected: V1=−30 kV, V2=0 kV, V3=+20 kV, V4=0 kV and V6=−29 kV.

Figure 7:
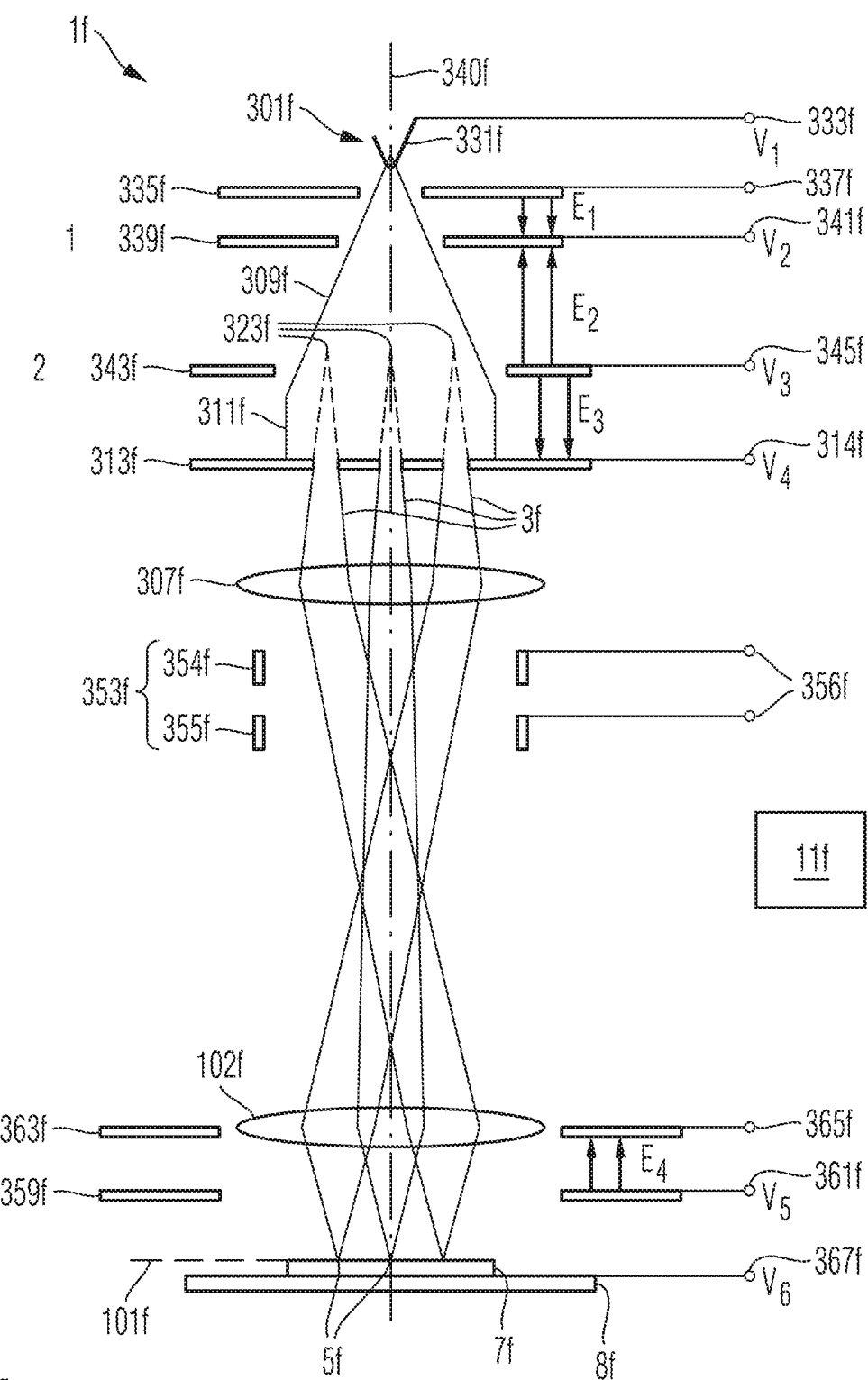
FIG. 7 schematically illustrates particle beam paths in a charged particle beam system according to a sixth embodiment.

FIG. 7 is a schematic illustration of a further charged particle beam system 1$f$ in which a plurality of charged particle beamlets 3$f$ are directed onto a surface of an object 7$f$ mounted on an object mount 8$f$. The charged particle beam, system 1$f$ has a configuration similar to the systems illustrated with reference to FIGS. 2 to 6 above. For example, a divergent particle beam 309$f$ is extracted from a particle source 301$f$ and accelerated by an electric field E1 generated between an extractor electrode 335$f$ and a first electrode provided by a single-aperture plate 339$f$. For this purpose, a particle emitter 331$f$ of the particle source 301$f$ is maintained at an electric potential V1, and the first aperture plate 339$f$ is maintained at a potential V2. A second aperture plate 343$f$ is positioned downstream of the first aperture plate 339$f$ and maintained at a voltage V3 selected such that a decelerating electric field E2 is generated between the first and second electrodes 339$f$ and 343$f$. A multi-aperture plate 313$f$ is positioned downstream of the second aperture plate 343$f$ and maintained at an electric potential V4 selected such that an accelerating electric field E3 is generated between the single-aperture plate 343f and the multi-aperture plate 313f. The decelerating electric field E2 generated on the upstream side of the second aperture plate 343f and the accelerating electric field. E3 provided on the downstream side of the second aperture plate 343f result in that a focusing lens function is provided on the diverging beam 309f. This focusing function 309f converges the diverging beam 309f such that a parallel beam 311f is formed. The parallel beam 311f is incident on the multi-aperture plate 313f. The accelerating electric field E3 provided on the upstream side of the multi-aperture plate 313f results in that a diverging lens function is provided to each of the particle beamlets 3f traversing the apertures of the multi-aperture plate 313f. Therefore, the particle beamlets 3f generated from the incident beam 311f are diverging particle beamlets 3f. At positions downstream of the multi-aperture plate 313f, the particle beamlets 3f appear to originate from virtual beamlet foci 323f positioned upstream of the multi-aperture plate 313f as indicated by dotted lines in FIG. 7. The virtual beamlet foci 323f are imaged onto the surface of the object 7f positioned in an object plane 101f using imaging optics configured similar to the imaging optics illustrated with reference to FIGS. 2 to 6 above. It is to be noted that a decelerating electric field E4 is provided upstream of the object 7f, wherein the decelerating electric field E4 can be generated between electrodes 363f and 359f as shown in FIG. 7, or between an electrode and the object 7f itself. Moreover, a deflector arrangement 353f can be positioned at a suitable location along the beam path between the virtual beamlet foci 323f and the object surface 101f.

The voltage V1 can be a negative high voltage, the voltage V2 can be close to or equal to ground potential, the voltage V3 can be a negative high voltage, the voltage V4 can be close to or equal to ground potential, and the voltage V6 can be a negative high voltage. In the present example, the following voltages are selected: V1=−30 kV, V2=0 kV, V3=−20 kV, V4=0 kV and V6=−29 kV.

In the particular embodiments illustrated above, it is to be noted that some of the electrodes are maintained at ground potential while the Figures indicate separate terminals connected to the controller to maintain the respective electrodes at desired voltages. It is apparent that, if the desired voltages are 0 kV, separate terminals connected to the controller can be omitted and that the electrodes maintained at ground potential may have a suitable connection to ground.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

The invention claimed is:

1. A charged particle beam system, comprising:
    a particle beam source configured to generate a particle beam wherein the particle beam source includes a particle emitter;
    a first electrode downstream of the particle beam source;
    a multi-aperture plate downstream of the first electrode;
    a second electrode downstream of the multi-aperture plate;
    a third electrode downstream of the second electrode;
    a deflector downstream of the third electrode;
    an objective lens downstream of the deflector;
    a fourth electrode downstream of the deflector; and
    an object mount configured to mount an object such that a surface of the object is located downstream of the objective lens;
    a voltage supply configured to maintain
        the particle emitter at a first voltage;
        the first electrode and/or the multi-aperture plate at a second voltage;
        the second electrode at a third voltage;
        the third electrode at a fourth voltage;
        the fourth electrode at a fifth voltage; and
        object mount at a sixth voltage;
    wherein
        an absolute value of a first difference between the first voltage and the second voltage is greater than a first voltage amount;
        an absolute value of a second difference between the second voltage and the third voltage is greater than the first voltage amount;
        an absolute value of a third difference between the third voltage and the fourth voltage is greater than the first voltage amount;
        an absolute value of a fourth difference between the fourth voltage and the fifth voltage or the sixth voltage is greater than the first voltage amount;
        the first difference and the second difference have a same sign;
        the third difference and the fourth difference have a same sign; and
        the first difference and the third difference have opposite signs.

2. The particle beam system of claim 1, wherein the first voltage amount is greater than at least one of 10 kV, 20 kV and 30 kV.

3. The particle beam system of claim 1, wherein the deflector comprises plural electrodes configured to generate an electric deflection fields oriented transverse to a direction of propagation of the particles of the beamlets.

4. The particle beam system of claim 1, further comprising a first magnetic focusing lens downstream of the beam source and upstream of the deflector.

5. The particle beam system of claim 4, wherein the first focusing lens is positioned upstream of the multi-aperture plate.

6. The particle beam system of claim 4, wherein a crossover of a bundle of particle beamlets is formed downstream of the multi-aperture plate upstream of the fourth electrode.

7. The particle beam system of claim 4, further comprising a second focusing lens downstream of the crossover.

8. The particle beam system of claim 7, further comprising a third focusing lens downstream the multi-aperture plate and upstream of the crossover.

9. The particle beam system of claim 6, further comprising a fifth electrode downstream of the deflector and upstream of the crossover,
    wherein the voltage supply is further configured to maintain the fifth electrode at a seventh voltage;
    wherein an absolute value of a fifth difference between the fourth voltage and the seventh voltage is greater than a second voltage amount; and
    wherein the first difference and the fifth difference have a same sign.

10. The particle beam system of claim 1, further comprising a detector configured to detect electrons originating from the surface of the object, and wherein the particle beam system is a multi-beam microscope.

11. A charged particle beam system, comprising:
a particle beam source configured to generate a particle beam wherein the particle beam source includes a particle emitter;
a first electrode downstream of the particle beam source;
a multi-aperture plate downstream of the first electrode;
a second electrode downstream of the multi-aperture plate;
a third electrode downstream of the second electrode;
a deflector downstream of the third electrode;
an objective lens downstream of the deflector;
a fourth electrode downstream of the deflector; and
an object mount configured to mount an object such that a surface of the object is located downstream of the objective lens;
a voltage supply configured to maintain
the particle emitter at a first voltage;
the first electrode and/or the multi-aperture plate at a second voltage;
the second electrode at a third voltage;
the third electrode at a fourth voltage;
the fourth electrode at a fifth voltage; and
object mount at a sixth voltage;
wherein
an absolute value of a first difference between the first voltage and the second voltage is greater than a first voltage amount;
an absolute value of a second difference between the second voltage and the third voltage is greater than the first voltage amount;
an absolute value of a third difference between the third voltage and the fourth voltage is greater than the first voltage amount;
an absolute value of a fourth difference between the fourth voltage and the fifth voltage or the sixth voltage is greater than the first voltage amount;
the first difference and the third difference have a same sign;
the second difference and the fourth difference have a same sign; and
the first difference and the second difference have opposite signs.

12. The particle beam system of claim 11, wherein the first voltage amount is greater than at least one of 10 kV, 20 kV and 30 kV.

13. The particle beam system of claim 11, wherein the deflector comprises plural electrodes configured to generate an electric deflection fields oriented transverse to a direction of propagation of the particles of the beamlets.

14. The particle beam system of claim 11, further comprising a first magnetic focusing lens downstream of the beam source and upstream of the deflector.

15. The particle beam system of claim 14, wherein the first focusing lens is positioned upstream of the multi-aperture plate.

16. The particle beam system of claim 14, wherein a crossover of a bundle of particle beamlets is formed downstream of the multi-aperture plate upstream of the fourth electrode.

17. The particle beam system of claim 16, further comprising a second focusing lens downstream of the crossover.

18. The particle beam system of claim 17, further comprising a third focusing lens downstream the multi-aperture plate and upstream of the crossover.

19. The particle beam system of claim 11, further comprising a detector configured to detect electrons originating from the surface of the object, and wherein the particle beam system is a multi-beam microscope.

20. A charged particle beam system, comprising:
a particle beam source configured to generate a particle beam wherein the particle beam source includes a particle emitter;
a first electrode downstream of the particle beam source;
a second electrode downstream of the first electrode;
a third electrode downstream of the second electrode;
a multi-aperture plate downstream of the third electrode;
a deflector downstream of the third electrode;
an objective lens downstream of the deflector;
a fourth electrode downstream of the deflector; and
an object mount configured to mount an object such that a surface of the object is located downstream of the objective lens;
a voltage supply configured to maintain
the particle emitter at a first voltage;
the first electrode and/or the second electrode at a second voltage;
the third electrode at a third voltage;
the multi-aperture plate at a fourth voltage;
the fourth electrode at a fifth voltage; and
object mount at a sixth voltage;
wherein
an absolute value of a first difference between the first voltage and the second voltage is greater than a first voltage amount;
an absolute value of a second difference between the second voltage and the third voltage is greater than the first voltage amount;
an absolute value of a third difference between the third voltage and the fourth voltage is greater than the first voltage amount;
an absolute value of a fourth difference between the fourth voltage and the fifth voltage or the sixth voltage is greater than the first voltage amount;
the first difference and the second difference have a same sign;
the third difference and the fourth difference have a same sign; and
the first difference and the third difference have opposite signs.

21. The particle beam system of claim 20, wherein the first voltage amount is greater than at least one of 10 kV, 20 kV and 30 kV.

22. The particle beam system of claim 20, wherein the deflector comprises plural electrodes configured to generate an electric deflection fields oriented transverse to a direction of propagation of the particles of the beamlets.

23. The particle beam system of claim 20, further comprising a first magnetic focusing lens downstream of the beam source and upstream of the deflector.

24. The particle beam system of claim 23, wherein a crossover of a bundle of particle beamlets is formed downstream of the multi-aperture plate upstream of the fourth electrode.

25. The particle beam system of claim 24, further comprising a second focusing lens downstream of the crossover.

26. The particle beam system of claim 20, further comprising a detector configured to detect electrons originating from the surface of the object, and wherein the particle beam system is a multi-beam microscope.

27. A charged particle beam system, comprising:
a particle beam source configured to generate a particle beam wherein the particle beam source includes a particle emitter;

a first electrode downstream of the particle beam source;
a second electrode downstream of the first electrode;
a multi-aperture plate downstream of the second electrode;
a deflector downstream of the multi-aperture plate;
an objective lens downstream of the deflector;
a third electrode downstream of the deflector; and
an object mount configured to mount an object such that a surface of the object is located downstream of the objective lens;
a voltage supply configured to maintain
the particle emitter at a first voltage;
the first electrode at a second voltage;
the second electrode at a third voltage;
the multi-aperture plate at a fourth voltage;
the third electrode at a fifth voltage; and
object mount at a sixth voltage;
wherein
an absolute value of a first difference between the first voltage and the second voltage is greater than a first voltage amount;
an absolute value of a second difference between the second voltage and the third voltage is greater than the first voltage amount;
an absolute value of a third difference between the third voltage and the fourth voltage is greater than the first voltage amount;
an absolute value of a fourth difference between the fourth voltage and the fifth voltage or the sixth voltage is greater than the first voltage amount;
the first difference and the third difference have a same sign;
the second difference and the fourth difference have a same sign; and
the first difference and the second difference have opposite signs.

28. The particle beam system of claim 27, wherein the first voltage amount is greater than at least one of 10 kV, 20 kV and 30 kV.

29. The particle beam system of claim 27, wherein the deflector comprises plural electrodes configured to generate an electric deflection fields oriented transverse to a direction of propagation of the particles of the beamlets.

30. The particle beam system of claim 27, further comprising a first magnetic focusing lens downstream of the beam source and upstream of the deflector.

31. The particle beam system of claim 30, wherein the first focusing lens is positioned upstream of the multi-aperture plate.

32. The particle beam system of claim 30, wherein a crossover of a bundle of particle beamlets is formed downstream of the multi-aperture plate upstream of the fourth electrode.

33. The particle beam system of claim 31, further comprising a second focusing lens downstream of the crossover.

34. The particle beam system of claim 27, further comprising a detector configured to detect electrons originating from the surface of the object, and wherein the particle beam system is a multi-beam microscope.

* * * * *

UNITED STATES PATENT AND TRADEMARK OFFICE
CERTIFICATE OF CORRECTION

PATENT NO. : 10,541,112 B2
APPLICATION NO. : 16/176392
DATED : January 21, 2020
INVENTOR(S) : Stefan Schubert, Thomas Kemen and Rainer Knippelmeyer Page 1 of 1

It is certified that error appears in the above-identified patent and that said Letters Patent is hereby corrected as shown below:

In the Specification

Column 6, Line 29: "the these" should read "these"

Column 14, Line 8: "a objective" should read "an objective"

Column 12, Line 50: "V1=30 kV" should read "V1=–30 kV"

Column 12, Line 50: "V3=20 kV" should read "V3=–20 kV"

Signed and Sealed this
Second Day of March, 2021

Drew Hirshfeld
*Performing the Functions and Duties of the
Under Secretary of Commerce for Intellectual Property and
Director of the United States Patent and Trademark Office*